United States Patent [19]

Priebe

[11] Patent Number: 5,604,712

[45] Date of Patent: Feb. 18, 1997

[54] FAST WORD LINE DECODER FOR MEMORY DEVICES

[75] Inventor: Gordon W. Priebe, Maple Grove, Minn.

[73] Assignee: LSI Logic Corporation, Milpitas, Calif.

[21] Appl. No.: 527,704

[22] Filed: Sep. 13, 1995

[51] Int. Cl.[6] .................................. G11C 7/00; G11C 8/00
[52] U.S. Cl. ................... 365/230.06; 365/194; 365/203; 365/204
[58] Field of Search ........................ 365/230.06, 203, 365/204, 194

[56] References Cited

U.S. PATENT DOCUMENTS

| | | | |
|---|---|---|---|
| 4,514,829 | 4/1985 | Chao | 365/230.06 |
| 4,774,421 | 9/1988 | Hartmann et al. | 365/185 |
| 5,022,010 | 6/1991 | Chan | 365/230.06 |
| 5,051,959 | 9/1991 | Nakano et al. | 365/230.06 |
| 5,391,941 | 2/1995 | Landry | 326/106 |

*Primary Examiner*—David C. Nelms
*Assistant Examiner*—Trong Quang Phan
*Attorney, Agent, or Firm*—Katz & Cotton LLP

[57] ABSTRACT

A word line decoder gate including a plurality of parallel-coupled devices coupled to a common node for receiving and decoding an address upon assertion of a clock signal, where each parallel device receives a corresponding address signal or its inverted counterpart depending upon the particular address being decoded. A precharge device is coupled to the common node for keeping it at a first voltage level until the clock signal is asserted, and two series coupled charge devices are coupled between a source voltage and the common node, which charge devices attempt to charge the common node to a second voltage level during a time period while the clock signal is asserted and a delayed clock signal remains deasserted. A delay device receives the clock signal and asserts the delayed clock signal. However, any one or more of the parallel devices, if activated, provides a current path from said common node to override the two charge devices to keep the common node substantially at the first voltage level. Since decoding is performed in parallel, the present invention is easily extendible to as many address inputs as desired without any loss in performance. In the preferred embodiment, the parallel-coupled devices are discharge devices for keeping the common node discharged. Also in the preferred embodiment, a charge sustaining circuit is preferably coupled between the common node and the source voltage for reducing the effects of stray capacitance.

23 Claims, 9 Drawing Sheets

FAST WORD LINE DECODER FOR MEMORY DEVICES

BACKGROUND OF THE INVENTION

1. Technical Field of the Invention

The present invention relates to memory devices, and more particularly to a relatively fast and efficient word line decoder having a reduced number of transistors.

2. Description of the Related Art

Memory array devices, such as static RAM (random access memory) or ROM (read-only memory) devices or the like, require row and column address decoders to access the desired digital information (bits) of the memory array. The present disclosure primarily concerns the row or word line decoder for a memory device, although the techniques described herein are applicable to other decoding schemes. Single stage word line decoders using conventional complementary metal-oxide semiconductor (CMOS) decoding techniques require a substantial number of CMOS transistors to implement the decoder. Thus, single stage designs are limited to a small number of address lines and are not sufficient for practical designs having more address lines. Dual-stage word line decoders reduce the number of transistors required, but introduce significant delay for the two separate decoder stages.

If the number of address bits, referred to by the integer "n," is relatively small, such as n=4 or less, then word line decoding may be achieved in a single stage. For example, if n=4, then $2^n=16$ NAND gates are necessary to implement the word line decoder, where each NAND gate includes n=4 inputs. In the conventional design, a four-input NAND gate requires four P-channel transistors and four N-channel transistors for a total of 2(n)=8 transistors for each word line NAND gate. Thus, a total of 16×8=128 transistors are required for a four-bit word line decoder.

It is easy to see that as the number of address lines increases, the number of transistors required to implement a conventional single stage decoder becomes excessive. For example, for nine address lines, over 9,000 such CMOS transistors are required, just for the word line decoder alone. Such single-stage implementations become too large and costly for practical purposes.

Furthermore, since each decoding gate is typically implemented using a stack of series connected N-channel transistors, a practical limit exists on the number of inputs or width of each decoding gate. The resistance of the stack increases with each added N-channel transistor, where the total resistance becomes excessive very quickly. Since the output capacitance is generally fixed, each added transistor resistance increases the switching time of the gate, which correspondingly slows down the memory device itself One way to reduce the series resistance is to increase the size or the width/length (w/l) ratio of each transistor. This is undesirable because it correspondingly increases the size of the transistor, and thus the size of the overall memory device. For these reasons, single stage decoders using conventional CMOS technology is typically limited to a small number of address lines, such as four or less.

One way to reduce the number of transistors is the use of pre-charging techniques where only one P-channel device is required This effectively reduces the number of overall transistors by half for the overall single-stage decoder. However, the N-channel devices are still stacked in series and the pre-charging technique requires an additional N-channel device to be added to file stack. In this manner, such pre-charging techniques do not completely solve the practical address line limit of single stage decoders.

For the reasons listed above, designers have used two-stage decoders which include a predecoder stage and a postdecoder stage. The address lines are effectively grouped and provided to predecoder stages for developing a predecoder bus. For example, four address lines are divided into two groups of two, where each group of two is provided to a corresponding 2:4 decoder to create an eight-bit predecoder bus. Likewise, nine address lines are divided into three groups of three address lines, where each group of three is provided into a corresponding 3:8 decoder for developing a 24-bit predecoder bus, and so on. The use of two stages reduces the number of inputs required for each gate in the postdecoder stage to the number of decoders in the predecoder stage. In this manner, the postdecoder stage uses sixteen, two-input word line gates for four address lines, or 512 three-input word line gates for nine address lines. It is clear, therefore, that the use of predecoder and postdecoder stages substantially reduces the number of transistors required to implement the overall word line decoder. However, the introduction of two separate stages effectively doubles the time required to complete the word line decode process.

It is desired to provide an improved word line decoder which is very fast, yet implemented with a relatively small number of transistors.

SUMMARY OF THE INVENTION

It is therefore an object of the present invention to provide an improved word line decoder which is very fast and is implemented with a relatively small number of transistors.

A word line decoder gate according to the present invention includes a plurality of parallel-coupled devices coupled to a common node for receiving and decoding an asserted address upon assertion of a clock signal, where each parallel-coupled device receives a corresponding address signal or its inverted counterpart depending upon a predetermined address being decoded. A precharge device is coupled to the common node for keeping it at a first voltage or logic level until the clock signal is asserted, and two series coupled charge devices are coupled between a source voltage and the common node, these charge devices attempt to charge the common node to a second voltage or logic level during a time period when the clock signal is asserted and while a delayed clock signal remains deasserted. A delay device receives the clock signal and asserts the delayed clock signal. However, any one of the parallel-coupled devices provides a current path from the common node for overriding the two charge devices to keep the common node substantially at the first voltage level if the asserted address does not match the predetermined address. Since decoding is performed in parallel, the present invention is easily extendible to as many address inputs as desired without any loss in performance.

In the preferred embodiment, a buffer or inverter circuit coupled to the common node asserts a corresponding word line signal if the asserted address equals the particular address. Also, the first logic or voltage level is essentially ground, so that the parallel-coupled and precharge devices are all discharge devices. The charge devices attempt to increase the voltage of the common node for switching the buffer and asserting the word line signal. Thus, the buffer is toggled for asserting the word line signal if none of the discharge devices are turned on, but is not toggled if any one of the parallel-coupled discharge devices is turned on. Also, a charge sustaining circuit is preferably coupled between the common node and the source voltage for reducing the effects of stray capacitance.

A word line decoder according to the present invention preferably includes n inverters for providing a corresponding inverted address signal for each of n input address signals. Furthermore, $2^n$ n-input word line decoder gates are provided, one for each of the $2^n$ word line select signals required to decode the n address signals. Each decoder gate includes n parallel discharge devices, each for receiving a corresponding address bit or its inverted counterpart.

In the preferred embodiment, the parallel-coupled discharge devices comprise a plurality of N-channel CMOS transistors coupled in parallel between the common select node and ground. Thus, each address bit or its inverted counterpart is provided to the gate of a corresponding N-channel transistor. Furthermore, the two series-coupled charge devices preferably comprises two pull-up P-channel CMOS transistors. The precharge device preferably comprises a pull-down N-channel transistor for pre-discharging the common node. An inverted word line enable (WLEN) signal controls one of the pull-up transistors and the pull-down transistor, and a delayed word line enable (WLED) signal controls the other pull-up transistor.

A word line enable (WLE) signal is asserted when the address signals are stabilized by appropriate logic. The WLEN signal is then asserted low, turning off the discharge or pull-down device and turning on the other charge or pull-up device, so that both pull-up devices attempt to pull the common select node high. After a delay period, the WLED signal is asserted high, turning off its pull-up device. Thus, the pull-down device is released and the address is sampled only during the delay period while the WLEN signal is asserted and the WLED signal is deasserted, where the pull-up devices attempt to pull the common node to a high logic level. Each of the parallel pull-down devices, however, are implemented to overcome both of the pull-up devices, so that the common node remains low if any one or more of the parallel pull-down devices are turned on. In this manner, if none of the parallel-coupled pull-down devices are turned on, the common node is asserted high and the inverter is switched, thereby selecting the corresponding word line signal.

An advantage of the word line decoder according to the present invention is a substantial reduction in the number of transistors per word line gate. The number of CMOS transistors is equal to the number of address lines plus three transistors to implement the pre-discharge logic. Furthermore, increasing the number of address bits does not cause a reduction in performance, since decoding is preformed in parallel. In this manner, a predecoder stage is not necessary and the address bits or their complementary counterparts may be provided directly to the inputs of each word line gate. Thus, the number of gates to implement the word line decoder is dramatically reduced and the speed is effectively increased by eliminating a decoder stage when compared to a dual-stage decoder.

Another advantage of the word-line decoder according to the present invention is that it may be implemented in either synchronous or asynchronous designs. The WLE clocking signal is asserted by appropriate logic whenever the address becomes stable. The WLE signal is either based on a synchronous clock signal or an asynchronous translation detection (ATD) pulse. The delay between the WLEN and the WLED signals is sufficient to cause switching of the word line inverter if that particular gate device is selected. In this manner, all timing is based upon the WLE signal and therefore may be used in synchronous or asynchronous designs.

It is now appreciated that a word line decoder according to the present invention simultaneously reduces the number of transistors and increases the speed of word line decode over conventional CMOS technology. Therefore, the size and cost of the resulting memory is substantially reduced while its speed is substantially increased.

In an alternative embodiment, an additional discharge device controlled by the WLED signal is coupled in series with all of the parallel-coupled discharge devices for low power applications. Although the speed of the low power embodiment is somewhat reduced, it is useful for low power applications where speed is less critical.

Other and further objects, features and advantages will be apparent from the following description of presently preferred embodiments of the invention, given for the purpose of disclosure and taken in conjunction with the accompanying drawings.

DETAILED DESCRIPTION OF THE PREFERRED EMBODIMENT

Throughout the figures, all like elements have the same number and similar elements have the same number and a different lower case letter suffix.

Figure 1:
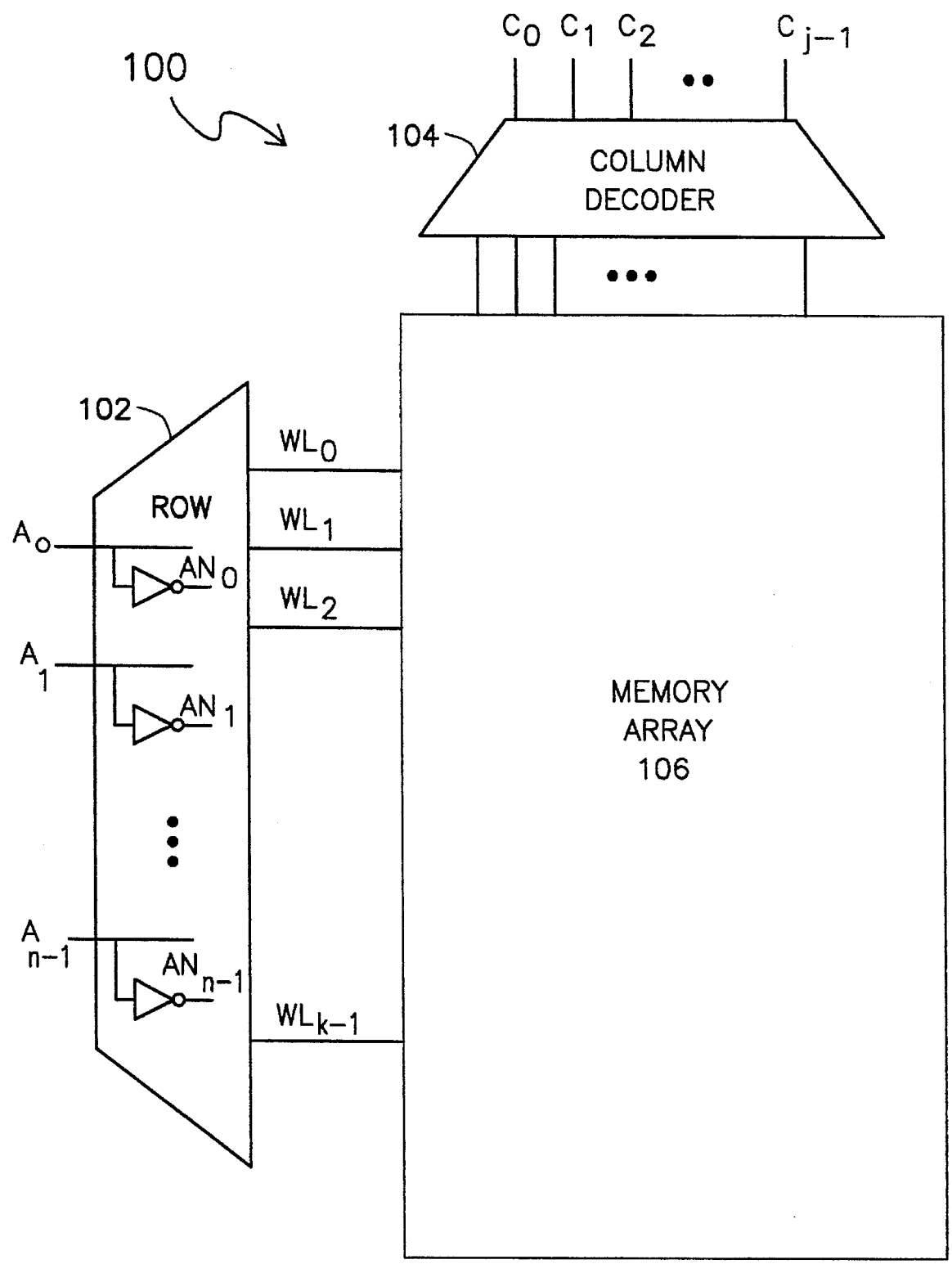
FIG. 1 is a simplified block diagram of a general memory system for accessing data in a memory array.

Referring now to FIG. 1, a simplified block diagram is illustrated of a memory system 100 for accessing data in a memory array 106, where the memory system 100 is either implemented according to prior art or according to the present invention. A word line decoder 102 generally receives n address signals $A_0, A_1, A_2, \ldots A_{n-1}$ for asserting k word line signals $WL_0, WL_2, WL_2, \ldots WL_{k-1}$ to the memory array 106, where k and n are integers such that $k=2^n$. Also, a column decoder 104 receives j address signals $C_0, C_1, \ldots C_{j-1}$ for asserting a plurality of column signals to the memory array 106. The present invention primarily concerns the word line decoder 102, where the column decoder 104 is not further described.

A word line decoder, such as the word line decoder 102, often includes an inverter for each of the address signals $A_0$–$A_{n-1}$ for providing corresponding inverted address signals $AN_0$–$AN_{n-1}$. An "N" placed at the end of a signal name generally denotes negative or inverted logic. Although the n inverters double the address bus to include each address bit and its inverted counterpart, decoding is made simpler. In particular, the word line decoder 102 includes n inverters, which receive the $A_0, A_1, \ldots AN_{n-1}$ signals, respectively, for asserting inverted signals $AN_0, AN_1, \ldots AN_{n-1}$ signals, respectively.

Figure 2B:
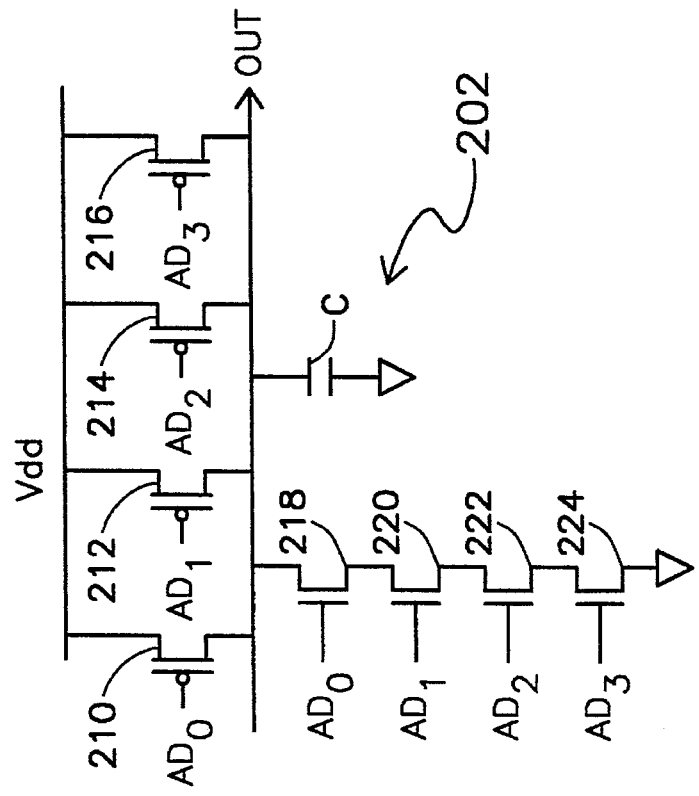
FIG. 2B is a more detailed schematic diagram of an implementation of the NAND gate of FIG. 2A.
Figure 2A:
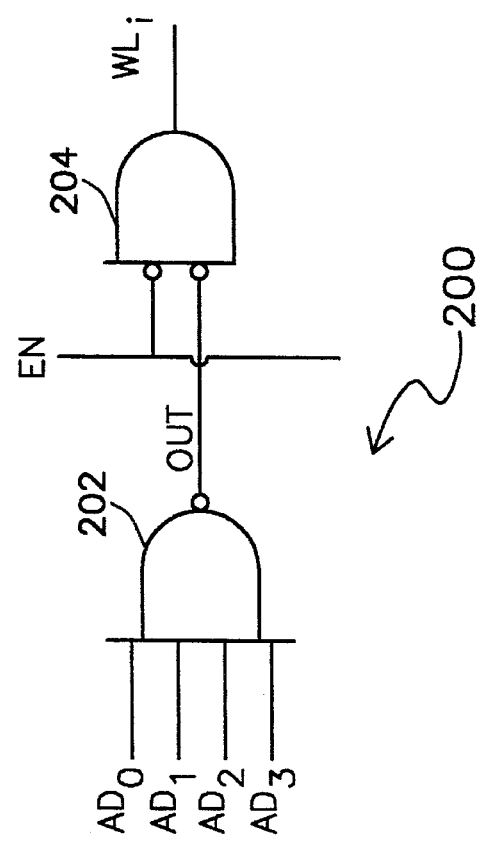
FIG. 2A is a logic block diagram of a single-stage decoder NAND gate according to prior art.

FIG. 2A is a simplified schematic diagram of a portion of a word line decoder 200 according to prior art. A NAND gate 202 has four inputs for receiving four address signals, or their respective inverted counterparts. $A_0$ or $AN_0$, $A_1$ or $AN_1$, $A_2$ or $AN_2$ and $A_3$ or $AN_3$, for asserting an OUT signal to one input of a two-inverted input AND gate 204. Thus, for each input, an address signal or its inverted counterpart, is provided to each input of the NAND gate 202, depending upon the particular address being decoded for that word line. For purposes of simplicity, an address signal $A_n$ and its inverted counterpart $AN_n$ are generally referred to as $AD_n$, so that the inputs to the NAND gate 202 are represented as $AD_0$–$AD_3$.

An enable signal EN is provided to the other inverted input of the AND gate 204, which asserts a word line signal $WL_i$, where i is an integer from 0 to k. In general, the $WL_i$ word line signal is selected or asserted high when both the OUT and EN signals are asserted low. The OUT signal is asserted low only when all of the $AD_0$–$AD_3$ address signals are asserted high. Thus, it is possible to fashion a word line decoder by providing sixteen (16) four-input NAND gates, similar to the NAND gate 202, for each word line signal for a 4-bit address bus. However, such an embodiment becomes impractical very quickly as the number of address bits increases beyond four. For example, a nine-bit address bus requires $2^9=512$ such NAND gates, each having nine inputs. As described below, 512 nine-input NAND gates is impractical.

FIG. 2B is a schematic diagram of a possible embodiment of the NAND gate 202. Each of the address bits $AD_0$–$AD_3$ are provided to the respective gates of four P-channel complimentary metal-oxide semiconductor (CMOS) transistors 210, 212, 214 and 216, each having their sources pulled high to a source voltage $V_{dd}$ and their drains connected to a common output node for asserting the output signal OUT. A capacitor C is coupled between the OUT node and ground. The address bits $AD_0$–$AD_3$ are also provided to the respective gates of four N-channel CMOS transistors 218, 220, 222 and 224, connected in series between the OUT node and ground. In this manner, the OUT signal remains high unless all of the address bits $AD_0$–$AD_3$ are asserted high, thereby pulling the OUT signal low to select the word line signal $WL_i$ when the enable signal EN is asserted.

The implementation of the NAND gate 202 illustrated in FIG. 2B is sufficient for a relatively small number of inputs, but quickly grows impractical as the number of address bits increases. Each of the N-channel CMOS transistors 218–224 has an associated drain to source resistance, where the total series resistance increases each time another N-channel CMOS transistor is added. Since the capacitance C is relatively fixed, the switching time for the NAND gate 202 increases with each added CMOS transistor. Therefore, as the number of inputs increases, the switching time of the overall NAND gate 202 increases, thereby decreasing its speed.

One method of decreasing the resistance of each of the series N-channel CMOS transistors 218–224 is to increase its width/length (w/l) ratio, thereby increasing its size. However, it is easily seen that increasing the size of each of the N-channel devices with a corresponding increase in the number of N-channel devices geometrically increases the total size of the NAND gate 202. In summary, it is impractical to implement a large-scale word line decoder with a NAND gate implemented similar to that illustrated in FIG. 2B.

Figure 3B:
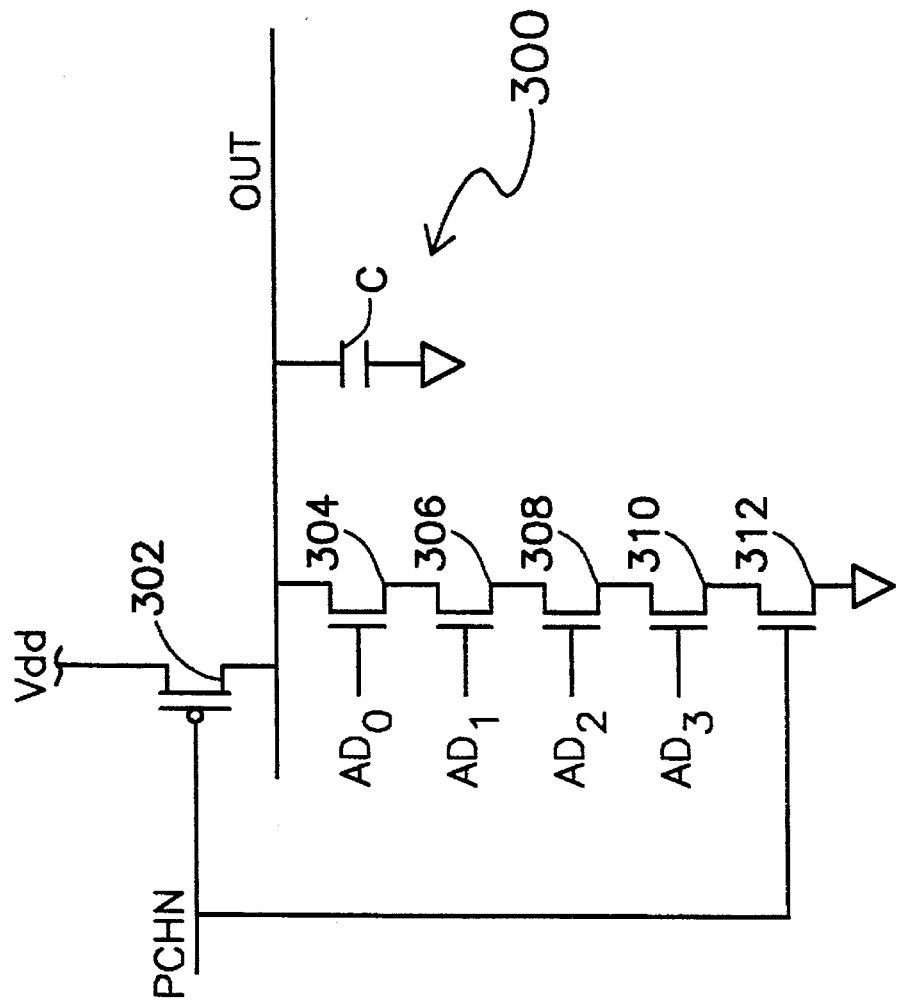
FIG. 3B is a more detailed schematic implementation of the NAND gate of FIG. 3A.
Figure 3A:
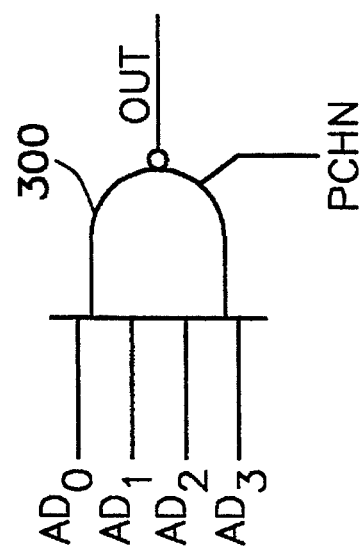
FIG. 3A is an alternative embodiment of the NAND gate of FIG. 2A according to prior art using pre-charging techniques.

FIG. 3A is a NAND gate 300 implemented using dynamic pre-charging techniques according to prior art. An inverted pre-charge signal PCHN is held low for precharging the NAND gate 300 and is asserted high to monitor the output signal OUT. FIG. 3B shows a more detailed schematic diagram of the NAND gate 300. A single P-channel CMOS transistor 302 has its drain and source coupled between the $V_{dd}$ signal and the OUT node and the capacitor C is provided between the OUT node and ground. A series-coupled stack of N-channel CMOS transistors 304, 306, 308 and 310 receiving corresponding address signals $AD_0$–$AD_3$, respectively, as well as an extra N-channel CMOS transistor 312, are coupled in series between the OUT signal and ground. The PCHN signal is provided to the gate of the CMOS transistors 302 and 312 In operation, the PCHN signal is initially held low turning on the P-channel CMOS transistor 302 and turning off the N-channel CMOS transistor 312, which pulls the OUT signal high and charges the capacitor C. While the PCHN signal is low, the address bits $AD_0$–$AD_3$ may stabilize. When the address bits are ready to be sampled, the PCHN signal is asserted high, turning off the P-channel CMOS transistor 302 and turning on the N-channel CMOS transistor 312 The OUT signal remains high unless all of the address bits $AD_0$–$AD_3$ are asserted high turning on all of the N-channel CMOS transistors 302–310, which pulls the OUT signal low.

FIG. 3B illustrates that the number of transistors used to implement a given word line gate can be reduced using dynamic precharge techniques. Nonetheless, the resistance of the stacked series of N-channel devices is actually made worse since an additional N-channel device must be added to the stack. Therefore, although the overall size is reduced, the timing is not improved over the embodiment illustrated in FIG. 2B, so that implementation is still limited to a relatively small number of inputs.

Figure 4:
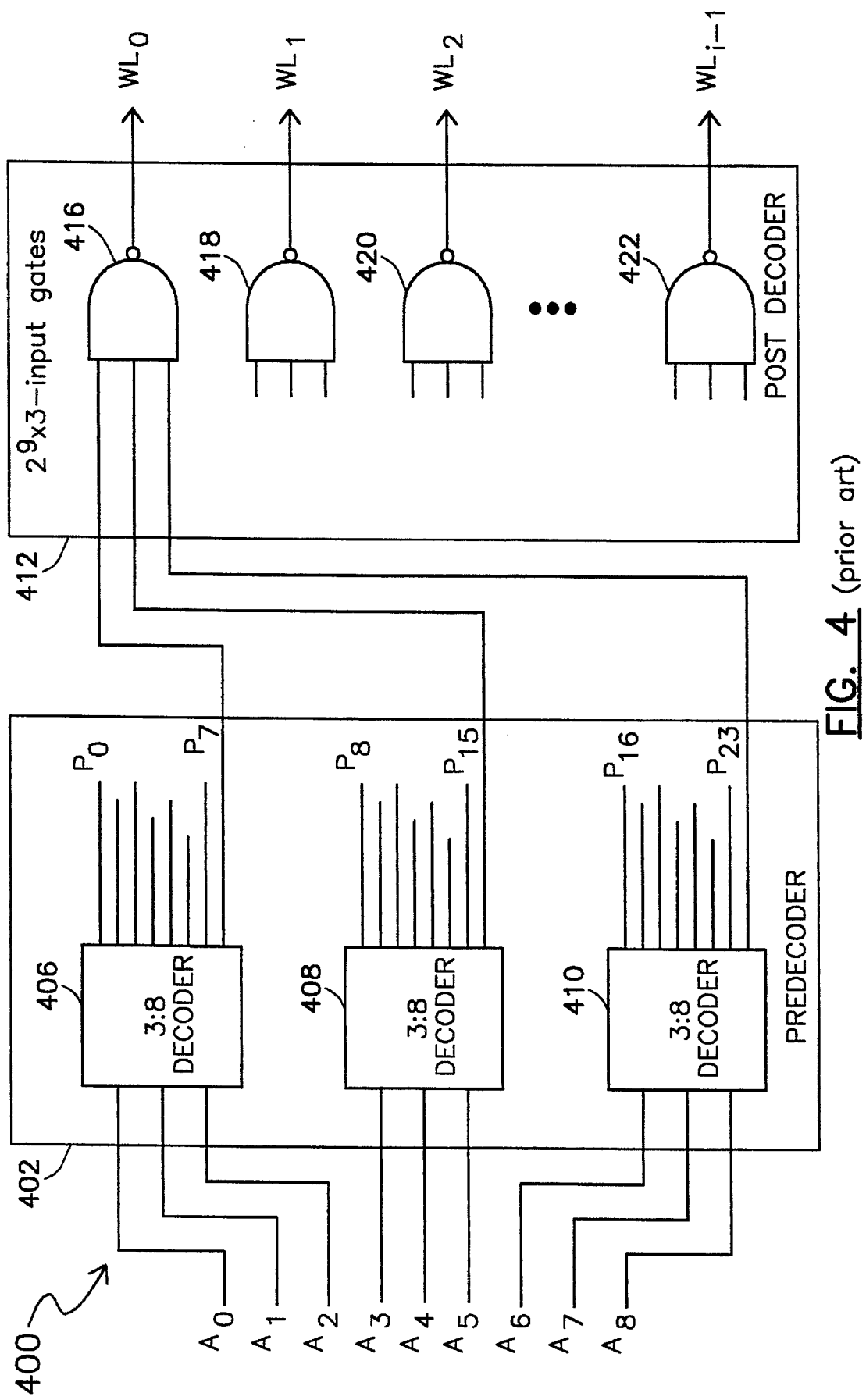
FIG. 4 is simplified block diagram of a dual-stage word line decoder according to prior art with a predecoder and a postdecoder stages.

Referring now to FIG. 4, another word line decoder 400 is illustrated according to an alternative embodiment of prior art. In this case, nine address bits $A_0, A_1, A_2, A_3, A_4, A_5, A_6, A_7$ and $A_8$ are provided to the respective inputs of a predecoder 402 for asserting a 24-bit predecoder bus, comprising signals $P_0$–$P_{23}$, to the respective inputs of a postdecoder 412. The predecoder 402 preferably includes three 3:8 decoders 406, 408 and 410, which divide the input address $A_0$–$A_8$ into three groups of three. In particular, the decoder 406 receives the $A_0$–$A_2$ signals and asserts signals $P_0$–$P_7$, the decoder 408 receives the $A_3$–$A_5$ signals and asserts signals $P_8$–$P_{15}$, and the decoder 410 receives the $A_6$–$A_8$ signals and asserts signals $P_{16}$–$P_{23}$. Thus, each of the decoders 406, 408 and 410 provide eight bits of the predecoder bus. One of the eight predecoder output signals of each of the decoders 406, 408 and 410 is then provided to the respective inputs of $2^9=512$ by 3-input NAND gates 416, 418, 420, . . . 422, which assert corresponding word line signals $WL_0, WL_1, WL_2, \ldots WL_{k-1}$ where k equals 512 for nine address bits.

The word line decoder 400 illustrated in FIG. 4 alleviates the problem of having a high number of input signals per gate by dividing the decoding task into two separate stages, a predecoder stage and a postdecoder stage. In this manner, a word line decoder may be implemented with a high number of address bits without requiring an excessive number of inputs for each word line gate for asserting a corresponding word line signal. However, dividing the word line decoding task into two separate stages generally requires twice the amount of time to achieve the decoding task through two separate stages. This is a typical trade-off in prior art memory decoders.

Figure 5:
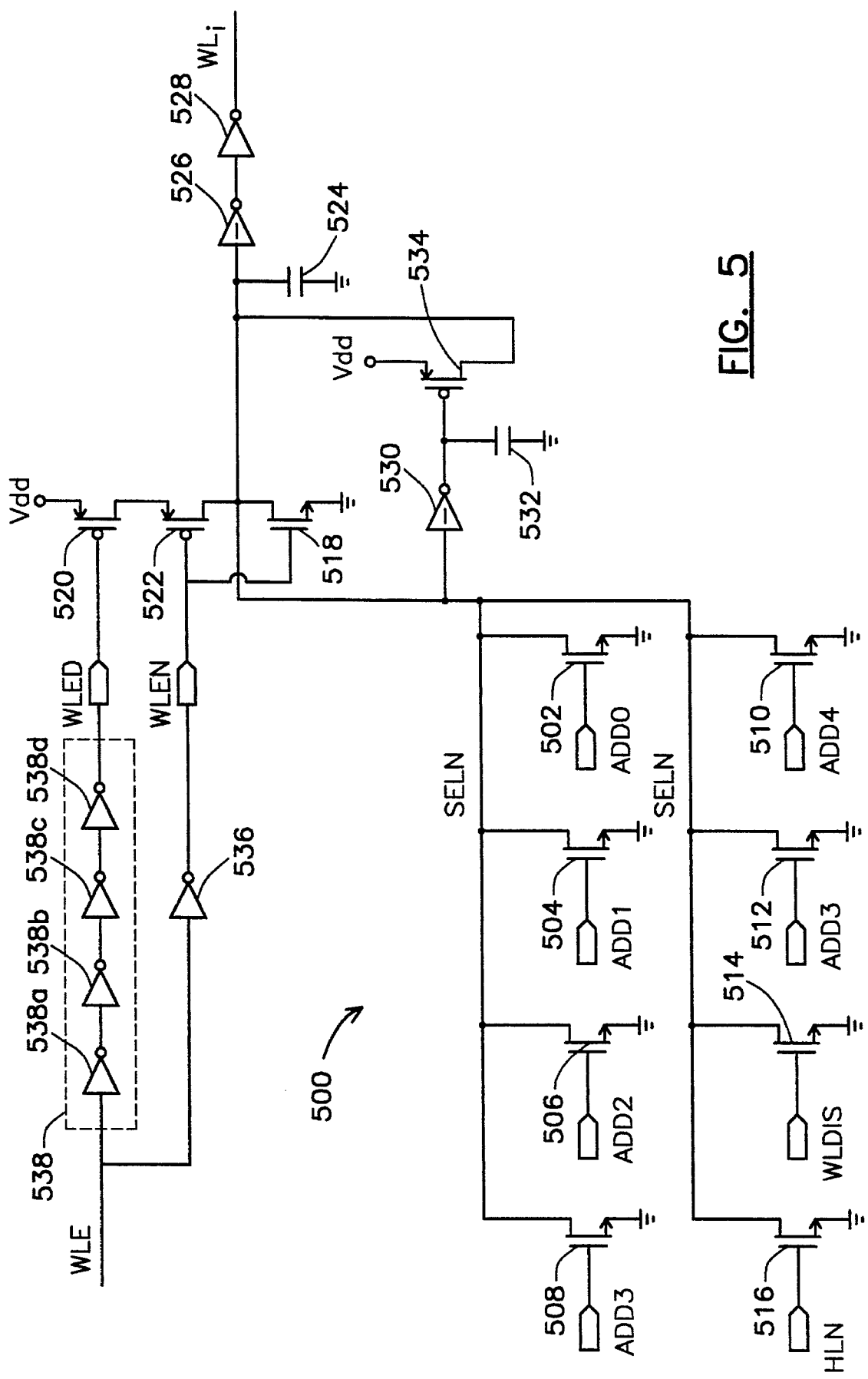
FIG. 5 is a schematic diagram of a word line decoder according to the present invention.

Referring now to FIG. 5, a schematic diagram of a word line decoder gate 500 is illustrated, according to the present invention. Six address bits ADD0, ADD1, ADD2, ADD3, ADD4 and ADD5 are provided to the respective gates of six N-channel CMOS transistors 502, 504, 506, 508, 510 and 512, respectively. It is noted that each of the address bits ADD0–ADD5 represents the actual address bit ($A_n$) or its inverted counterpart ($AN_n$), depending upon the particular address being decoded. Also, a word line disable signal WLDIS is provided to the gate of another N-channel CMOS transistor 514 and a hit line signal HLN is provided to the gate of another N-channel CMOS transistor 516. The WLDIS signal provides a method of turning off all word line decoders very quickly, if desired, for purposes of timing or the like. The HLN signal may be an address bit from an associative memory, such as used in the application of a translation lookaside buffer (TLB) as part of a Memory Management Unit (MMU), as known to those skilled in the art. The address bits ADD0–ADD5 and the associated signals WLDIS and HLN, along with their inverted counterparts, will be collectively referred to herein as signals ADDR, ADDRN.

All of the CMOS transistors 502, 504, 506, 508, 510, 512, 514, 516 have their drains connected together to a common select node, referred to as a node or signal SELN, and have their sources connected to ground. In this manner, the address bus and associated signals are provided to a plurality of N-channel devices connected in parallel rather than in series. As will be described more fully below, any number of address inputs may be added to the word line decoder gate 500 without affecting operation or performance due to this parallel connectivity of the N-channel devices. The word line decoder gate 500 logically operates as a NOR gate. The CMOS transistors 502–516 each function as discharge or pull-down devices for discharging or otherwise reducing the voltage of the SELN node when turned on.

It is also noted that in alternative embodiments, the parallel pull-down devices could be P-channel devices where the opposite address signal is provided to control each device. This reasoning applies for all N and P-channel devices, where inverted logic could be used instead. The present invention is thus not limited to any particular polarity or device type, and may used with positive or negative logic, or a combination of both.

The SELN node is provided to the drain of another N-channel CMOS transistor 518, having its source connected to ground. The CMOS transistor 518 is also a discharge or pull-down device for pre-discharging or keeping the voltage of the SELN node low while turned on. Two P-channel CMOS transistors 520 and 522 are connected in series between the source voltage $V_{dd}$ and the SELN signal. In particular, the source of the P-channel CMOS transistor 520 is connected to the $V_{dd}$ signal and its drain is connected to the source of another P-channel CMOS transistor 522, having its drain connected to the SELN node. The two P-channel CMOS transistors 520, 522 together act as charge or pull-up devices for pulling the voltage of the SELN node high when turned on. The SELN node is filtered through a capacitor 524 and provided to the input of an inverter 526. The output of the inverter 526 is provided to the input of another inverter 528, having its output asserting a word line enable signal $WL_i$, where i is an integer representing the particular address being decoded as described previously.

It is noted that coupling or stray capacitance may affect the voltage level of the SELN signal during normal operation. For this purpose, an inverter 530 has its input receiving the SELN signal and its output coupled to one end of a capacitor 532 and to the gate of another P-channel CMOS transistor 534. The source of the CMOS transistor 534 is pulled to $V_{dd}$ and its drain is coupled to the SELN signal. The P-channel CMOS transistor 534 helps to control coupling or stray capacitance from causing the SELN signal to drift into an invalid state when released.

A word line enable clock signal WLE is asserted by appropriate logic (not shown) when the address bits ADDR, ADDRN have all stabilized and are considered valid. The WLE signal is provided to the input of an inverter 536, having its output providing an inverted word line enable signal, referred to as WLEN. The WLE signal is also provided to the input of a delay device 538 for asserting a delayed word line enable signal at its output, referred to as WLED. It is desired that the WLED signal have a greater delay with respect to transitions of the WLE signal as compared to the WLEN signal. Therefore, the delay device 538 should have a greater delay than the inverter 536. The WLE, WLEN and WLED are considered clock signals for controlling the operation of the word line decoder gate 500. The timing is based on the rising edge of the WLE clock signal, and the delay period between the assertions of the WLEN signal low and the WLED signal high. The WLEN signal is time critical for operation of the present invention. The WLED signal is merely to reduce power consumption, and if power consumption is not critical, it may be eliminated entirely.

In the preferred embodiment, the delay device 538 preferably comprises four series-coupled inverters 538a, 538b, 538c and 538d coupled in series as illustrated in FIG. 5. In this manner, when the WLE signal is asserted, indicating that the address ADDR. ADDRN is valid, the WLEN signal is asserted low. Then, after a certain delay period, referred to as Δt, the WLED signal is asserted high. The inverter 536 and the delay device 538 may be implemented to provide any desired Δt delay value. The inverter 536 and the delay device 538 can be implemented once on the silicon die, wherein the output signals WLED and WLEN are available as needed for the circuits of the present invention.

Figure 6:
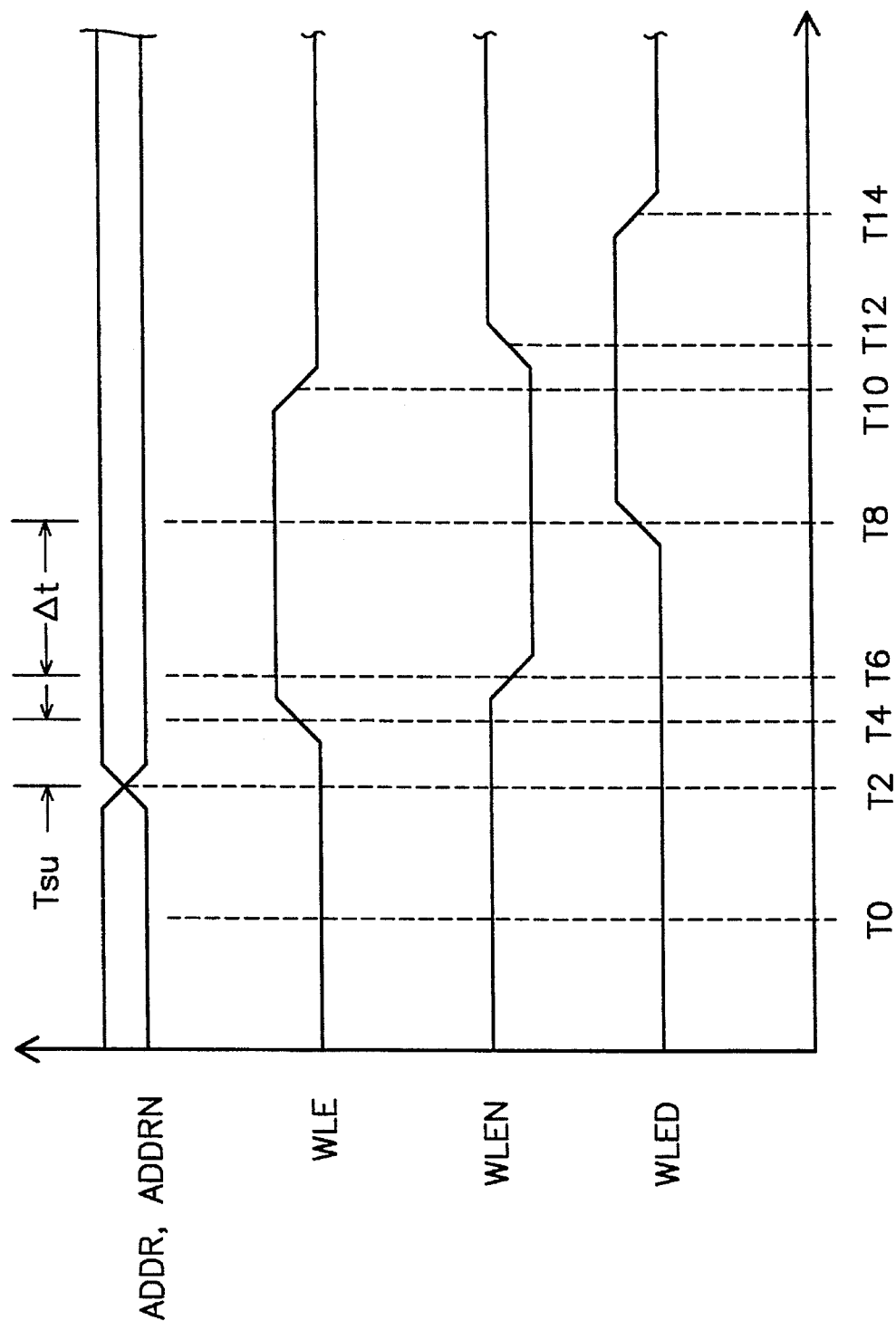
FIG. 6 is a timing diagram illustrating operation of the decoder of FIG. 5.

Operation of the word line decoder gate 500 is now described with reference to the timing diagram illustrated in FIG. 6. In a default state at time T0, the WLE signal is deasserted low, so that the WLEN signal is initially deasserted high. The WLEN signal thus initially turns off the P-channel CMOS transistor 522 and turns on the N-channel CMOS transistor 518 to discharge the SELN node. The WLED signal is deasserted low, so that the P-channel CMOS transistor 520 is turned on. However, the P-channel CMOS transistor 520 has little effect since the P-channel CMOS transistor 522 is turned off. The SELN node is pulled low through the N-channel CMOS transistor 518 in the default state, which also deasserts the $WL_i$ signal low through the inverters 526, 528. In the default state, the output of the inverter 530 is pulled high, charging the capacitor 532, which turns off the CMOS transistor 534.

The ADDR, ADDRN signals change at time T2 and stabilize a short time thereafter. The WLE signal is subsequently asserted high at time T4 after a setup time $T_{SU}$ from time T2. It is noted that the setup time $T_{SU}$, may be negative in some embodiments, where the WLE signal is actually asserted before the ADDR, ADDRN signals actually stabilize. After the delay through the inverter 536 from time T4, the WLEN signal is asserted low at time T6. The WLED signal is asserted high at time T8 after the delay through the delay device 538. Between times T6 and T8, which defines the Δt time period, the WLEN signal turns on the P-channel CMOS transistor 522 and turns off the N-channel CMOS transistor 518, so that N-channel CMOS transistor 518 is no longer pulling the SELN node low. Thus, the P-channel CMOS transistors 520, 522 attempt to pull the SELN node high to $V_{dd}$. However, if one or more of the ADDR, ADDRN address signals are asserted high, corresponding ones of the parallel N-channel CMOS transistors 502–516 are turned on, thereby pulling the SELN signal low.

In the preferred embodiment, any one of the N-channel CMOS transistors 502–516 overrides both of the P-channel CMOS transistors 520 and 522, so that the SELN node remains substantially discharged, which means that the voltage of the SELN node remains low enough to prevent toggling of the inverter 526. In this manner, if any of the address signals ADDR, ADDRN are high, the SELN signal remains low so that the $WL_i$ signal remains low and non-selected To achieve this function, the size of each of the CMOS transistors 502–516 is relatively large as compared to the size of the CMOS transistors 520, 522. This provides a sufficient resistive ratio to keep the voltage of the SELN node low enough to prevent toggling of the inverter 526. The parameters of the inverter 526 may also be designed to prevent toggling if any of the transistors 502–516 are turned on reducing the voltage of the SELN node.

On the other hand, if none of the ADDR, ADDRN address signals are high, then all of the N-channel CMOS transistors 502–516 remain turned off, so that the SELN node is pulled high through the P-channel CMOS transistors 520, 522. The inverters 526, 528 correspondingly toggle to assert the $WL_i$ signal. To alleviate the effects of stray capacitance, the inverter 530 is toggled so that it asserts its output low, thereby turning on the P-channel CMOS transistor 534, which injects further current to the SELN signal to keep it high. When the SELN signal is asserted high, the corresponding word line signal $WL_i$ is asserted high and thus considered selected.

After the delay period Δt, the WLED signal is asserted high at time T8 turning off the P-channel CMOS transistor 520. The WLE signal is eventually deasserted low at time T10, so that the WLEN signal is deasserted high at time T12 and the WLED signal is deasserted low at time T14. Thus, the entire word line decoder gate 500 is returned to its default state. The CMOS transistor 518 is once again activated, pulling the SELN signal low, turning off the inverter 530 and the P-channel CMOS transistor 534.

It is noted that if any of the N-channel CMOS transistors 502–516 are turned on during the time period Δt, that particular gate or word line signal $WL_i$ is not selected and a significant amount of current flows through the one or more activated CMOS transistors. Since only one of the word line gates is selected at any given time, the remaining word line gates are deselected and consume appreciable power. In fact, it has been observed that a word line decoder using a plurality of word line gates according to the gate 500 can consume approximately two to four times the power consumed in a conventional word line decoder using precharging techniques. However, a word line decoder according to the present invention is significantly faster than conventional decoders, and is substantially smaller and less expensive because significantly fewer transistors are required.

Figure 8:
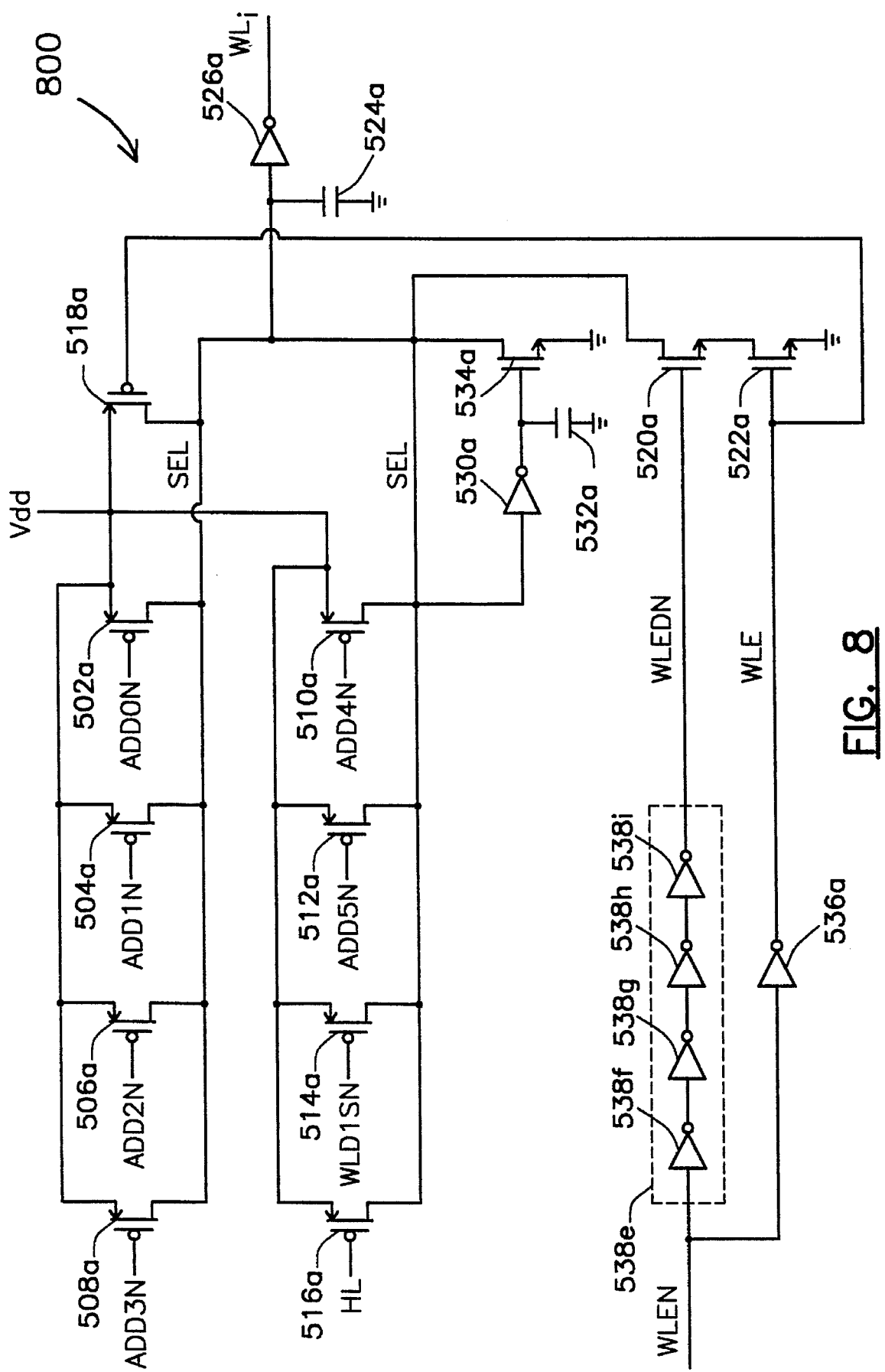
FIG. 8 is the word line decoder of FIG. 5 using P-channel and N-channel MOSFETs in place of the N-channel and P-channel MOSFETs, respectively.

It is noted that the embodiment illustrated in FIG. 5 is one embodiment of many possible embodiments and many variations. For example, referring to FIG. 8 the parallel-coupled MOSFETs 502–516 could alternatively be P-channel devices 502a–516a receiving the opposite (inverted) address signal. Also, the SEL node could be precharged high rather than low, where the MOSFET 518a would be coupled between the SEL node and the source voltage $V_{dd}$. The parallel-devices would then be used to provide charge paths to a source voltage to keep the SEL node charged if the asserted address did not equal the particular address represented by the combination of address bits provided to the parallel-coupled devices. The charge devices 520, 522 (FIG. 5) now discharge devices 520a, 522a would then attempt to discharge the SEL node, where any one or more of the parallel-devices 502a–516a would override the discharge devices 520a, 522a to keep the SEL node charged. In summary, the SEL common node is precharged to one voltage or logic level ($V_{dd}$ or $V_{ss}$). The two charge (FIG. 5) or discharge (FIG. 8) devices would attempt to pull the common node to a second voltage or logic level, which attempt is overridden by one or more of the parallel devices if the asserted address did not equal the predetermined address for each particular word line decoder gate. All devices of FIG. 8 function as described above for the embodiment of FIG. 5 except that the voltages $V_{dd}$ and $V_{ss}$ are interchanged and the N and P channel MOSFET transistors are interchanged. The operation and function of the circuits described in FIGS. 5 and 8 are functionally the same, except for being opposite in polarity, as is well known to those skilled in the art of transistor circuit logic design.

Figure 7:
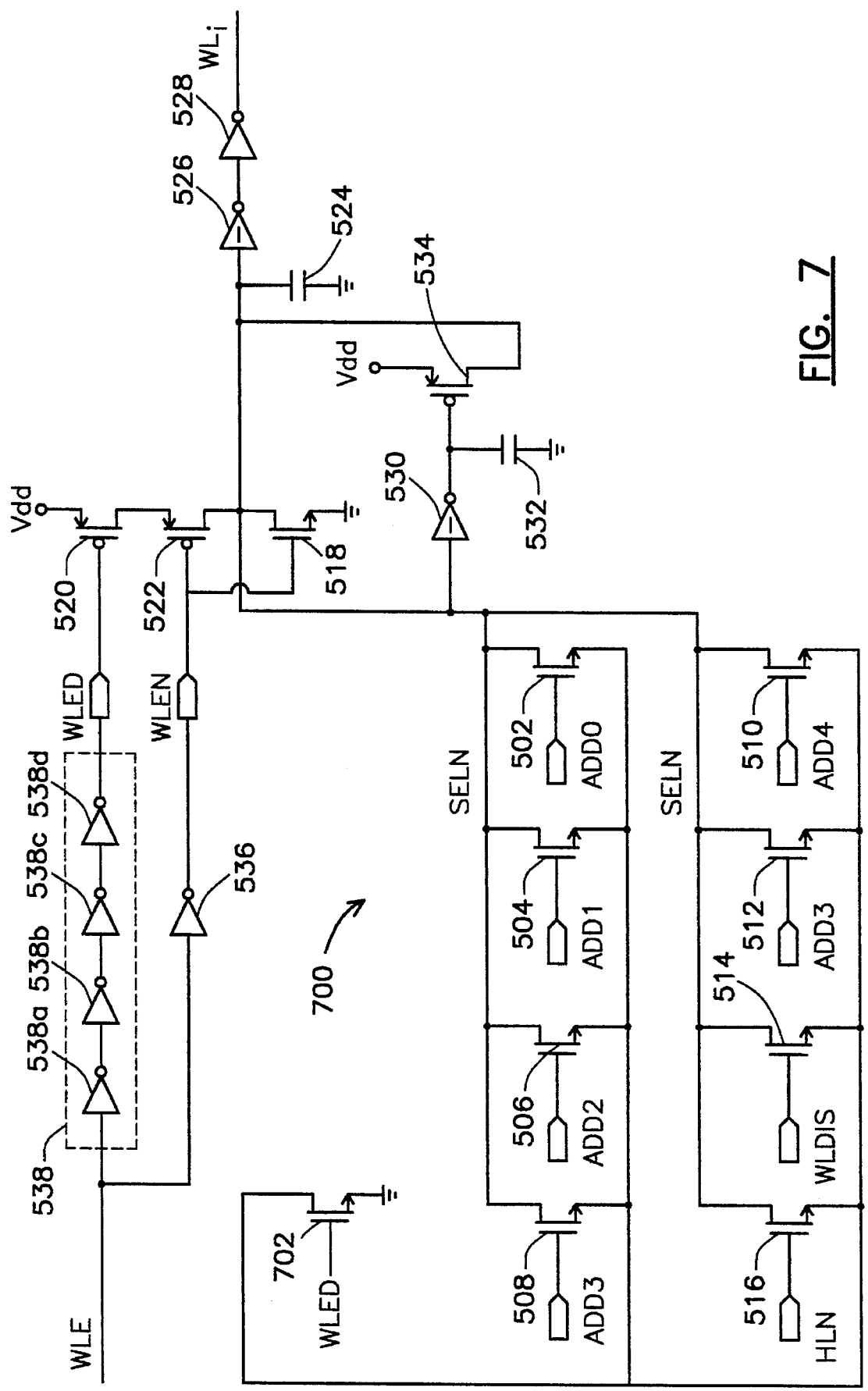
FIG. 7 is an alternative embodiment of a word line decoder according to the present invention.

FIG. 7 is a word line decoder gate 700 according to an alternative embodiment of the present invention. The word line decoder gate 700 is similar to the word line decoder gate 500, except that all of the sources of the parallel N-channel CMOS transistors 502–516 are connected to the drain of another N-channel CMOS transistor 702, having its source connected to ground. The gate of the CMOS transistor 702 receives the WLED signal. The inverter 536 and the delay device 538, as mentioned previously, can be implemented once on the silicon die, wherein the output signals WLED and WLEN are available as needed for the circuits of the present invention.

Operation of the word line decoder gate 700 is similar to the word line decoder gate 500, except that the $WL_i$ signal is not valid until after the WLED signal is asserted high. The N-channel MOSFETs 520, 522 begin to pull the SELN node high during the time period t. However, if any one of the address signals ADDR, ADDRN provided to the MOSFETs 502–516 are high, the SELN node is pulled back low. The SELN signal is deasserted quickly enough for the non-selected gates for appropriate decoding to occur. In this manner, the N-channel CMOS transistor 702 prevents significant current drain during the time delay period Δt between WLEN and WLED.

Figure 9:
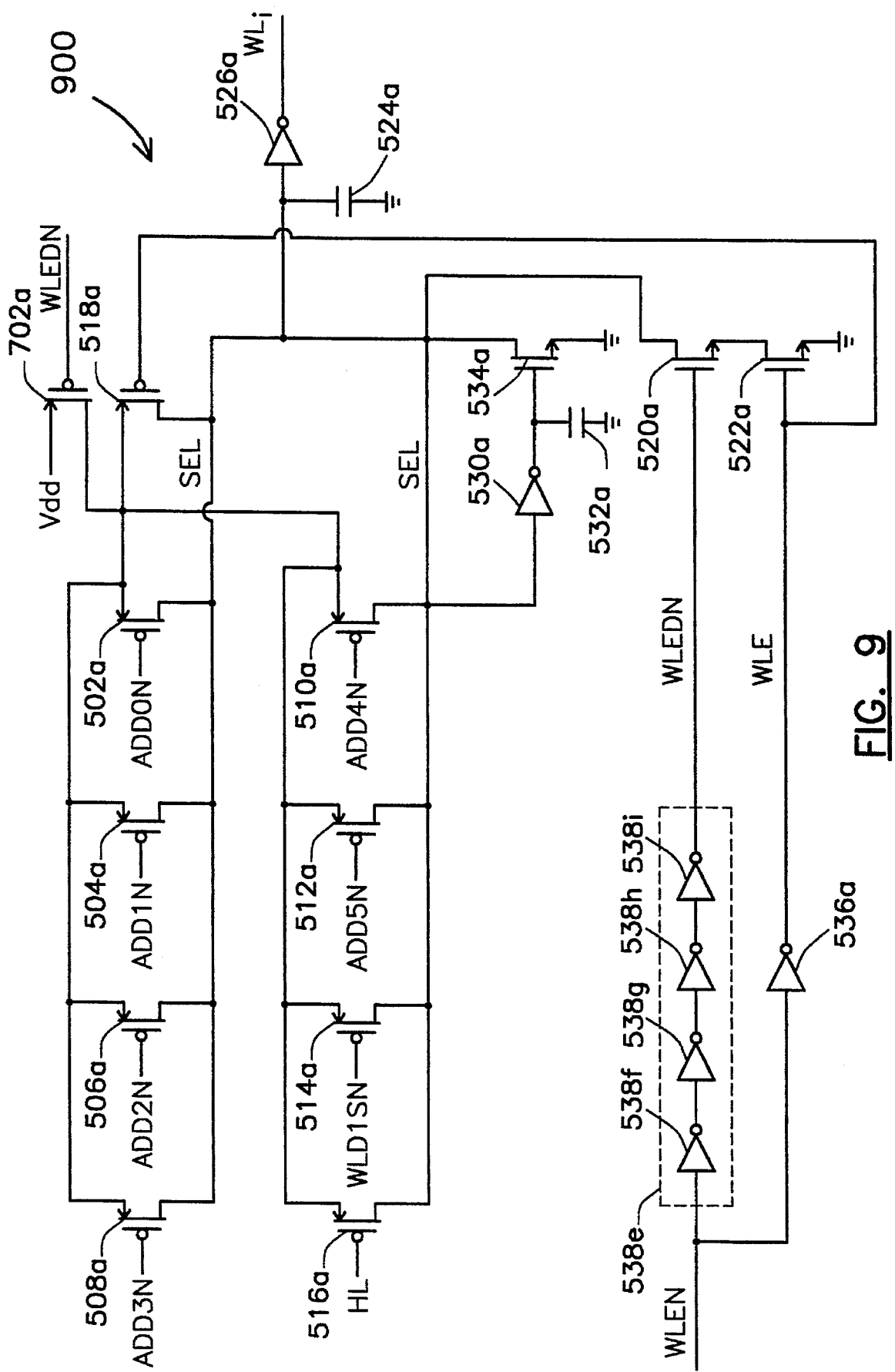
FIG. 9 is the word line decoder of FIG. 7 using P-channel and N-channel MOSFETs in place of the N-channel and P-channel MOSFETs, respectively.

The addition of the CMOS transistor 702 substantially reduces the current drain of the non-selected word line decoders, thereby substantially reducing the power of the word line decoder gate 700. However, the CMOS transistor 702 delays the decoding process until after the WLED signal is asserted, so that the word line decoder gate 700 is slower than the word line decoder gate 500. Nonetheless, the word line decoder gate 700 is still faster and uses less transistors than prior art decoders. All devices of FIG. 9 function as described above for the embodiment of FIG. 7 except that the voltages $V_{dd}$ and $V_{ss}$ are interchanged, and the N and P channel MOSFET transistors are interchanged. The operation and function of the circuits described in FIGS. 7 and 9 are functionally the same, except for being opposite in polarity, as is well known to those skilled in the art of transistor circuit logic design.

The present invention, therefore, is well adapted to carry out the objects and attain the ends and advantages mentioned, as well as others inherent therein. While a presently preferred embodiment of the invention and various aspects thereto has been given for purposes of disclosure, numerous changes in the details of construction, interconnection and arrangement has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A word line decoder gate for receiving and decoding an address asserted on a plurality of address signals in response to the assertion of a clock signal, comprising:

a plurality of first semiconductor devices coupled in parallel to a common node, each one of said plurality of first semiconductor devices connected to receive a corresponding one of the plurality of address signals or its inverted counterpart as a predetermined address, said plurality of first semiconductor devices comparing the asserted address on the plurality of address signals with said predetermined address;

a second semiconductor device coupled to said common node, said second semiconductor device receiving the inverted clock signal and keeping said common node at a first voltage level until the clock signal is asserted;

a delay device for receiving the clock signal and for asserting a delayed clock signal;

a third semiconductor device coupled to said common node and for receiving the inverted clock signal; and a fourth semiconductor device coupled between said third semiconductor device and a second voltage level and receiving said delayed clock signal, wherein said third and fourth semiconductor devices provide a current path from said second voltage level to said common node during a time period while said clock signal is asserted and said delayed clock signal is deasserted for pulling said common node to said second voltage level; wherein said plurality of first semiconductor devices allow said common node to go to said second voltage level during said time period if the asserted address equals said predetermined address, and wherein at least one of said plurality of first semiconductor devices provides a current path sufficient to keep said common node substantially discharged during said time period if the asserted address does not equal said predetermined address.

2. The word line decoder gate of claim 1, further comprising a buffer amplifier coupled to said common node for asserting a corresponding word line signal if none of said plurality of first semiconductor devices are turned on so as to provide a current path from said common node so that said common node remains at said second voltage level.

3. The word line decoder gate of claim 2, wherein said buffer amplifier comprises two series-coupled inverters.

4. The word line decoder gate of claim 1, further comprising a charge sustaining circuit coupled between said common node and said second voltage level for reducing the effect of stray capacitance.

5. The word line decoder gate of claim 4, wherein said charge sustaining circuit comprises:

an inverter having an input coupled to said common node;

a capacitor coupled to the output of said inverter; and a fifth semiconductor device having a control input coupled to said output of said inverter and said capacitor and having a current path coupled between said second voltage level and said common node, said fifth semiconductor device providing a current path between said second voltage level and said common node when the output of said inverter is asserted low.

6. The word line decoder gate of claim 1, wherein said plurality of first semiconductor devices each comprises discharge a device, and wherein said second semiconductor device is a predischarge device for initially discharging said common node.

7. The word line decoder gate of claim 6, wherein said plurality of first semiconductor devices each comprise an N-channel semiconductor device having a control terminal receiving said corresponding one of the plurality of address signals or its inverted counterpart and a current path coupled between said common node and said first voltage level.

8. The word line decoder gate of claim 7, wherein said N-channel semiconductor device comprises an N-channel CMOS transistor.

9. The word line decoder gate of claim 7, wherein said second semiconductor device comprises:

an inverter having an input for receiving the clock signal and having an output for asserting the inverted clock signal; and an N-channel semiconductor device having a control terminal for receiving said inverted clock signal and having a current path coupled between said common node and said first voltage level.

10. The word line decoder gate of claim 9, wherein said N-channel semiconductor device comprises an N-channel CMOS transistor.

11. The word line decoder gate of claim 9, wherein said third semiconductor device comprises a P-channel semiconductor device having a control terminal receiving said inverted clock signal and having a current path coupled between said fourth semiconductor device and said common node.

12. The word line decoder gate of claim 11, wherein said P-channel semiconductor device comprises a P-channel CMOS device.

13. The word line decoder gate of claim 11, wherein said fourth semiconductor device comprises a P-channel device having a control terminal receiving said delayed clock signal and a current path coupled between said second voltage level and said third semiconductor device.

14. The word line decoder gate of claim 13, wherein said fourth semiconductor device comprises a P-channel CMOS transistor.

15. The word line decoder gate of claim 6, further comprising a sixth semiconductor device coupled between said plurality of first semiconductor devices and said first voltage level and receiving said delayed clock signal.

16. The word line decoder gate of claim 15, wherein said sixth semiconductor device comprises an N-channel CMOS transistor having a gate receiving said delayed clock signal and a current path coupled between said plurality of first semiconductor devices and said first voltage level.

17. A word line decoder gate for selecting a word line based on a plurality of address signals in response to the assertion of a clock signal, comprising:

a plurality of pull-down address devices having current paths coupled in parallel to a common node, each having a control terminal for receiving a corresponding one of the plurality of address signals or its inverted counterpart;

a first pull-down device having a current path coupled between said common node and ground and having a control terminal for receiving the inverted clock signal for initially keeping said common node discharged until the inverted clock signal is asserted;

a delay device for receiving the clock signal and for asserting a delayed clock signal;

a first pull-up device having a current path coupled to said common node and a control terminal for receiving the inverted clock signal, wherein said first pull-up device is turned on when the inverted clock signal is asserted; and a second pull-up device having a current path coupled between said first pull-up device and a source voltage and having a control terminal receiving said delayed clock signal;

wherein during a time period after the clock signal is asserted and before said delayed clock signal is asserted, said first and second pull-up devices provide a current path between said source voltage and said common node to charge said common node, except that if at least one of said plurality of parallel pull-down devices is turned on during said time period, said at least one parallel pull-down device provides a current path sufficient to keep said common node substantially discharged.

18. The word line decoder gate of claim 17, further comprising a buffer coupled to said common node for asserting a corresponding word line signal.

19. The word line decoder gate of claim 17, further comprising a second pull-down address device having a current path coupled between said plurality of parallel pull-down devices and ground and having a control terminal receiving said delayed clock signal, said pull-down device being activated upon the assertion of said delayed clock signal.

20. A word line decoder for decoding a address asserted on N address signals upon the assertion of a clock signal and for asserting a corresponding one of $2^N$ word line signals, comprising:

N inverters each for receiving a corresponding one of said N address signals, said N inverters asserting corresponding N inverted address signals; and $2^N$ word line gates, each comprising:

N discharge devices coupled in parallel to a common node, each for receiving a corresponding one of the N address signals or its inverted counterpart representing a predetermined address, said N discharge devices for comparing the asserted address with said predetermined address;

a predischarge device coupled to said common node and for receiving the inverted clock signal for keeping said common node discharged until the clock signal is asserted;

a delay device for receiving the clock signal and for asserting a delayed clock signal;

a first charge device coupled to said common node and for receiving the inverted clock signal; and a second charge device coupled between said first charge device and a source voltage and receiving said delayed clock signal, wherein said first and second charge devices provide a current path from said source voltage to said common node during a time period while said clock signal is asserted and said delayed clock signal is deasserted for charging said common node;

wherein said N discharge devices allow said common node to be charged during said time period if the asserted address equals said predetermined address, and wherein at least one said N of discharge devices provides a current path sufficient to keep said common node substantially discharged during said time period if the asserted address does not equal said predetermined address.

21. A method, using a word line decoder gate, for receiving and decoding an address asserted on a plurality of address signals in response to the assertion of a clock signal, said method comprising:

receiving a plurality of address signals on a plurality of parallel-coupled devices coupled in parallel to a common node, each for receiving a corresponding one of the plurality of address signals or its inverted counterpart representing a predetermined address, said plurality of parallel-coupled devices for comparing the asserted address with said predetermined address;

receiving a inverted clock signal on a precharge device coupled to said common node, said precharge device receiving the inverted clock signal and keeping said common node at a first voltage level until the clock signal is asserted;

receiving the clock signal on a delay device, said delay asserting a delayed clock signal;

receiving the inverted clock signal on a first charge device coupled to said common node; and coupling a second charge device between said first charge device and a source voltage and receiving said delayed clock signal, wherein said first and second charge devices provide a current path from said source voltage to said common node during a time period while said clock signal is asserted and said delayed clock signal is deasserted for pulling said common node to a second voltage level;

wherein said plurality of parallel-coupled devices allow said common node to go to said second voltage level during said time period if the asserted address equals said predetermined address, and wherein at least one of said plurality of parallel-coupled devices provides a current path sufficient to keep said common node substantially discharged during said time period if the asserted address does not equal said predetermined address.

22. A computer memory address decoding system having a word line decoder gate for receiving and decoding an address asserted on a plurality of address signals in response to the assertion of a clock signal, said system comprising:

a computer memory address decoding system having a plurality of first semiconductor devices coupled in parallel to a common node, each one of said plurality of first semiconductor devices connected to receive a corresponding one of the plurality of address signals or its inverted counterpart representing a predetermined address, said plurality of first semiconductor devices comparing the asserted address on the plurality of address signals with said predetermined address;

a second semiconductor device coupled to said common node, said second semiconductor device receiving the inverted clock signal and keeping said common node at a first voltage level until the clock signal is asserted;

a delay device for receiving the clock signal and for asserting a delayed clock signal;

a third semiconductor device coupled to said common node and for receiving the inverted clock signal; and a fourth semiconductor device coupled between said third semiconductor device and a second voltage level and receiving said delayed clock signal, wherein said third and fourth semiconductor devices provide a current path from said second voltage level to said common node during a time period while said clock signal is asserted and said delayed clock signal is deasserted for pulling said common node to said second voltage level;

wherein said plurality of first semiconductor devices allow said common node to go to said second voltage level during said time period if the asserted address equals said predetermined address, and wherein at least one of said plurality of first semiconductor devices provides a current path sufficient to keep said common node substantially discharged during said time period if the asserted address does not equal said predetermined address.

23. A computer memory address decoding system having a word line decoder for decoding a address asserted on N address signals upon the assertion of a clock signal and for asserting a corresponding one of $2^N$ word line signals, said system comprising:

a computer memory address decoding system having N inverters each for receiving a corresponding one of said N address signals, said N inverters asserting corresponding N inverted address signals; and $2^N$ word line gates, each comprising:

N first devices coupled in parallel to a common node, each for receiving a corresponding one of the N address signals or its inverted counterpart representing a predetermined address, said N first devices for comparing the asserted address with said predetermined address;

a second device coupled to said common node and for receiving the inverted clock signal, wherein said second device keeps said common node discharged at a first voltage level until the clock signal is asserted;

a delay device for receiving the clock signal and for asserting a delayed clock signal;

a third device coupled to said common node and for receiving the inverted clock signal; and a fourth device coupled between said third device and a second voltage level and receiving said delayed clock signal, wherein said third and fourth devices provide a current path from said second voltage level to said common node during a time period while said clock signal is asserted and said delayed clock signal is deasserted for charging said common node;

wherein said of N first devices allow said common node to be charged during said time period if the asserted address equals said predetermined address, and wherein at least one of said N first devices provides a current path sufficient to keep said common node substantially said tint voltage level during said time period if the asserted address does not equal said predetermined address.

* * * * *